(12) United States Patent
Lee

(10) Patent No.: US 12,055,565 B2
(45) Date of Patent: Aug. 6, 2024

(54) LINEAR DISCRETE $R_{dson}$ TEMPERATURE $V_{GS}$ COMPENSATION

(71) Applicant: Alpha and Omega Semiconductor International LP, Toronto (CA)

(72) Inventor: Gilbert S. Z. Lee, Seongnam-si (KR)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 8 days.

(21) Appl. No.: 17/992,112

(22) Filed: Nov. 22, 2022

(65) Prior Publication Data

US 2024/0175901 A1 May 30, 2024

(51) Int. Cl.
*G01R 15/04* (2006.01)
*G01R 19/165* (2006.01)
*G01R 31/26* (2020.01)

(52) U.S. Cl.
CPC ....... *G01R 15/04* (2013.01); *G01R 19/16519* (2013.01); *G01R 31/2628* (2013.01)

(58) Field of Classification Search
CPC ............ G01R 19/2513; G01R 19/0092; G01R 19/165; G01R 21/06; G01R 31/00; G01R 19/00; G01R 31/2628; G01R 31/2874; G01R 19/155; G01R 19/0023; G01R 19/16566; G01R 31/388; G01R 15/146; G01R 15/144; G01R 19/0038; G01R 19/2503; G01R 31/2621; G01R 27/16; G01R 19/32; G01R 31/374; G01R 1/44; G01R 31/2872; G01R 19/0084; G01K 7/425; G01K 15/005; G01K 7/12; G01K 7/25; G01K 7/00; H03K 17/063; H03K 17/145; H03K 19/0185; H03K 2217/0054; H03K 3/012; H03K 17/00;
(Continued)

(56) References Cited

U.S. PATENT DOCUMENTS

| 5,156,005 A | 10/1992 | Redlich |
| 5,723,974 A | 3/1998 | Gray |
| 5,959,464 A | 9/1999 | Qualich |

(Continued)

FOREIGN PATENT DOCUMENTS

| CN | 205080180 U | 3/2016 |
| CN | 107390761 B | 2/2019 |
| TW | M574337 U | 2/2019 |

*Primary Examiner* — Vinh P Nguyen
(74) *Attorney, Agent, or Firm* — JDI PATENT; Joshua D. Isenberg; Robert Pullman

(57) ABSTRACT

A power MOSFET drain-source on resistance (Rdson) compensation device comprises circuitry configured to receive an input signal proportional to a voltage drop across a power MOSFET, a temperature dependent information and a gate-source voltage dependent information. The circuitry includes control logic and a first linear discrete voltage divider, wherein the first linear discrete voltage divider is configured to output a compensated voltage based on an at least one compensating control signal from the control logic that is based on at least one of the temperature dependent information or gate-source voltage dependent information.

18 Claims, 6 Drawing Sheets

(58) Field of Classification Search
CPC .......... H03K 17/04206; H03K 17/0822; G05F 1/561; G05F 1/567; G05F 3/16; G05F 1/56; G05F 1/562
See application file for complete search history.

(56) References Cited

U.S. PATENT DOCUMENTS

| | | | |
|---|---|---|---|
| 6,185,082 B1 | 2/2001 | Yang | |
| 6,304,108 B1* | 10/2001 | Inn | H03K 17/0822 327/543 |
| 6,507,227 B2* | 1/2003 | Genova | G01R 19/16519 327/512 |
| 6,998,827 B2 | 2/2006 | Gattavari et al. | |
| 7,180,278 B2 | 2/2007 | Tai et al. | |
| 7,224,199 B1 | 5/2007 | Kang | |
| 7,282,894 B2 | 10/2007 | Oswald et al. | |
| 7,332,358 B2* | 2/2008 | Orr | G01K 7/01 438/10 |
| 7,812,647 B2 | 10/2010 | Williams | |
| 8,598,941 B2 | 12/2013 | Bhattacharya et al. | |
| 8,629,669 B2 | 1/2014 | Tournatory et al. | |
| 8,692,477 B1 | 4/2014 | Lee | |
| 8,901,989 B2* | 12/2014 | Mehta | H03K 17/063 327/512 |
| 9,491,014 B1 | 11/2016 | Lee | |
| 9,853,548 B1 | 12/2017 | Zhang | |
| 9,991,792 B2* | 6/2018 | Isham | G01K 13/00 |
| 10,063,146 B1 | 8/2018 | Lee | |
| 10,243,550 B2 | 3/2019 | Nallamothu | |
| 10,830,799 B1 | 11/2020 | Lee | |
| 2012/0139518 A1 | 6/2012 | Cleveland et al. | |
| 2012/0235652 A1 | 9/2012 | Sheng et al. | |
| 2014/0241414 A1 | 8/2014 | Reidl et al. | |
| 2014/0268939 A1 | 9/2014 | Tomas et al. | |
| 2014/0277802 A1 | 9/2014 | Tomas et al. | |
| 2015/0255930 A1 | 9/2015 | Lee | |
| 2016/0049876 A1 | 2/2016 | Lee et al. | |
| 2016/0109488 A1 | 4/2016 | Dearborn et al. | |
| 2017/0115725 A1 | 4/2017 | Luo et al. | |
| 2017/0331369 A1 | 11/2017 | Sugimoto et al. | |
| 2017/0370875 A1 | 12/2017 | Ono et al. | |

\* cited by examiner

LINEAR DISCRETE $R_{dson}$ TEMPERATURE $V_{GS}$ COMPENSATION

FIELD OF THE DISCLOSURE

Aspects of the present disclosure generally relate to current sensing in metal oxide semiconductor field effect transistor (MOSFET) devices and more particularly to temperature and gate driving voltage ($V_{Gs}$) compensation in MOSFETS that use the resistance across the MOSFET when in the on state ($R_{dson}$) for current sensing.

BACKGROUND OF THE DISCLOSURE

In power systems for voltage regulation (VR) and current regulation (CR), the current information is important for output regulation and protection. Many power converter systems get the current information by calculating a dropout voltage generated by a current sensing resistor, e.g., a discrete resistor of known resistance, the DC resistance (DCR) of an inductor, or the $R_{dson}$ of a MOSFET.

A discrete resistor is accurate but requires additional cost and space and creates unwanted power loss. The DCR of an inductor does not require additional cost and space because it uses the parasitic DC resistance in the inductor coil but it has poor accuracy and high variation due to current flow distribution, temperature, aging of the inductor, etc.

$R_{dson}$ sensing of the MOSFET is the most energy efficient and economical current sensing method because there is no additional power loss and no need for expensive accurate devices or circuitry. However, $R_{dson}$ current sensing is dependent on several variable factors such as temperature, $V_{gs}$, operating current, process distribution, etc. Temperature and $V_{gs}$ variation are the main factors that affect the accuracy of $R_{dson}$ sensing. These factors have major effects on the current sensing accuracy when using $R_{dson}$ sensing. There is therefore a need to compensate for them.

Current methods for $R_{dson}$ sensing compensate for changes in both Temperature and $V_{gs}$ utilizing MOSFETs operating in the deep triode region. These MOSFETs' deep triode regions are themselves also sensitive to $V_{gs}$, and temperature conditions. As such, reliable operation is not guaranteed at more extreme temperatures, voltage conditions (e.g., $V_{gs}$, $V_{ds}$) or fast switching speeds. Additionally, these previous methods do not account for nonlinear variations in $R_{dson}$ that occur at the more extreme temperatures and Voltages.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Figure 1:
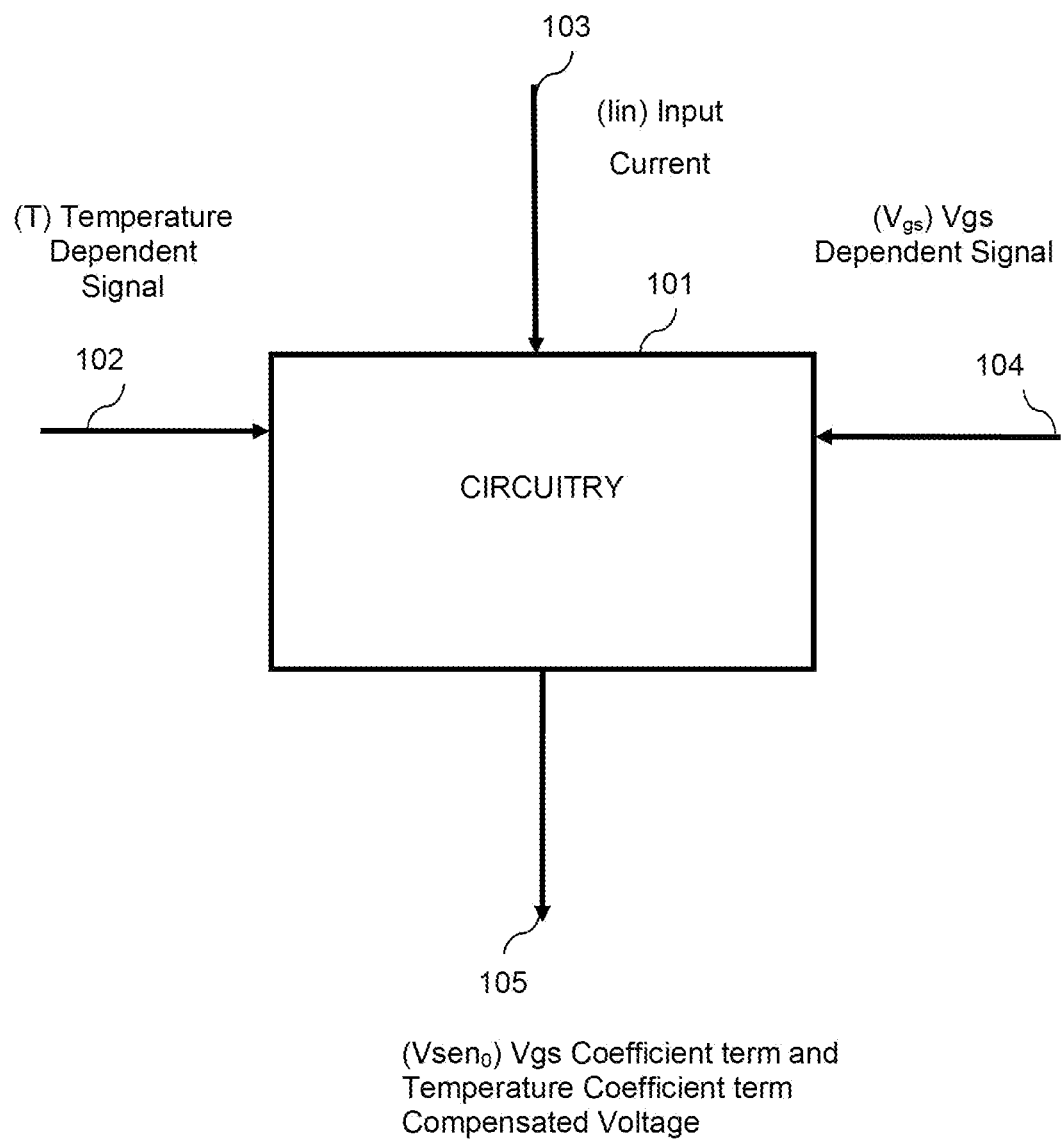
FIG. 1 is a block diagram of a compensation device according to an aspect of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Structure

High and low temperatures relative to some reference temperature $T_0$ can cause non-linear variations in $R_{dson}$. These non-linear variations in $R_{dson}$ may be approximately described with quadratic polynomial functions and thus may be accurately compensated using second order temperature coefficient (TC2) information in addition to the first order temperature coefficient (TC1) information. At high $V_{gs}$ or low $V_{gs}$, relative to a reference value $V_{gs0}$, for accurate $V_{gs}$ dependency compensation the value of $R_{dson}$ should change in a non-linear fashion, e.g., a polynomial of quadratic or higher order form. Similar to the temperature changes, these non-linear changes in $R_{dson}$ with $V_{gs}$ are modeled with a quadratic polynomial function. Thus, second order $V_{gs}$ coefficient (VC2) information may be used to more accurately represent changes in $R_{dson}$ due to $V_{gs}$ variation. Additionally, variations in the $R_{dson}$ due to temperature or $V_{gs}$ may be described with higher degree polynomial functions (e.g., third order or higher) and, as such, higher order temperature coefficient information or higher order $V_{gs}$, coefficient information may provide even greater accuracy.

Previously implemented devices have compensated for linear deviations in sensed current information due to variations in $R_{dson}$ from temperature change and $V_{gs}$, change when the $R_{dson}$ of a MOSFET is used for current sensing. Consequently, such previously implemented devices are not as accurate at compensating for changes in $R_{dson}$ at high temperature or low temperatures relative to $T_0$, due to the increased presence of non-linearity of $R_{dson}$ with change in temperature. Similarly, these previously implemented devices were also not as accurate at compensating for changes in $R_{dson}$ at high $V_{gs}$ or low $V_{gs}$. Additionally, the previously implemented compensation devices themselves included MOSFETs and thus were susceptible to non-linearity problems when operating at high or low temperatures causing additional inaccuracy. According to aspects of the present disclosure $R_{dson}$ sensing and variation compensation may be improved by using second or higher order, temperature or $V_{gs}$, coefficient information with the $R_{dson}$ compensation device. Additionally, problems with low and high temperature may be avoided through the use of a linear discrete voltage divider to output a compensated voltage instead of the compensation method using the linear characteristic in the MOSFET's deep triode operation, as done in the prior art.

FIG. 1 is a simplified block diagram of a compensation device according to an aspect of the present disclosure. Here, the circuitry 101 of the voltage compensation device receives an input current ($L_{in}$) 103, a signal or information dependent upon the temperature of the Power MOSFET (T) 102, and a signal or information dependent upon the gate driving voltage of the Power MOSFET ($V_{gs}$) 104. By way of example, and not by way of limitation, the signals 102, 103. 104 may be voltages or currents. The circuitry outputs a signal or information ($V_{sen0}$) 105 that is compensated for temperature and $V_{gs}$ variations with at least first order temperature and $V_{gs}$, coefficients or first order and second order temperature and $V_{gs}$ coefficients or First order, second order and higher order temperature and $V_{gs}$, coefficients. The signal or information $V_{sen0}$ may be, e.g., a voltage or current. Higher order coefficients may be third order, or third order and fourth order, or third order, fourth order and fifth order, or third order, fourth order, fifth order and any coefficient higher than fifth order suitable to describe the given Temperature or $V_{gs}$, $R_{dson}$ compensation curve.

The compensation device compensates for the effect temperature variation on $R_{dson}$ based on linear ($1^{st}$ order) temperature coefficient (TC1), and quadratic ($2^{nd}$ order) temperature coefficient (TC2) encoded into a first linear discrete voltage divider and two or more cascaded stages of switches connected to the linear discrete voltage divider. Moreover, the device also compensates for variations in $R_{dson}$ due to changes the gate driving voltage (voltage between a gate node and a source node) ($V_{gs}$) of the power MOSFET based on the linear ($1^{st}$ order) $V_{gs}$, coefficient (VC1), ($2^{nd}$ order) quadratic $V_{GS}$ coefficient encoded into a second linear discrete voltage divider and two or more cascaded stages of switches connected to the linear discrete voltage divider. Additionally, in some implementations, the compensation device may compensate for Rdson changes with first order, second order and higher order temperature coefficients or voltage coefficients. The presently described compensation device presents a more compact device and easier to implement method than previous attempts at compensation that is more accurate at high and low temperatures and high and low $V_{gs}$ as compared to reference.

Current sensing methods that use $R_{dson}$ (MOSFET on-resistance) sense the voltage drop between a MOSFET's drain and source, which is generated by the resistance of a power MOSFET, $R_{dson}$ and the current $I_{in}$ flowing through the MOSFET. However, because $R_{dson}$ is variable to temperature and $V_{gs}$ the sensed dropout voltage ($V_{sen}$) changes with relation to the variation $R_{dson}$ as shown below:

$$Rdson(T, Vgs) = \qquad \text{EQ. 1}$$
$$Rdson_0 \cdot (1 + TC1 \cdot \Delta T + TC2 \cdot \Delta T^2) \cdot (1 + VC1 \cdot \Delta VGS + TC2 \cdot \Delta VGS^2)$$

$$Isen(T, Vgs) = \frac{Vrdson(T, Vgs)}{Rsen} = \frac{Iin \cdot Rdson_0}{Rsen} \cdot \qquad \text{EQ. 2}$$
$$(1 + TC1 \cdot \Delta T + TC2 \cdot \Delta T^2) \cdot (1 + VC1 \cdot \Delta Vgs + VC2 \cdot \Delta Vgs^2)$$

$$Vsen(T, Vgs) = \frac{Isen(T, Vgs) \cdot Rgain}{RSen} = \frac{Rgain \cdot Iin \cdot Rdson_0}{Rsen} \cdot \qquad \text{EQ. 3}$$
$$(1 + TC1 \cdot \Delta T + TC2 \cdot \Delta T^2) \cdot (1 + VC1 \cdot \Delta Vgs + VC2 \cdot \Delta Vgs^2)$$

Where, $\Delta T = T - T_0$, $\Delta V_{gs} = V_{gs} - V_{gs0}$, $R_{dson}$ is the resistance across the power MOSFET in the on state at $T = T_0$ and $V_{gs} = V_{gs0}$ and the power MOSFET's Rdson has proportional coefficients (e.g., TC1: Linear temperature coefficient, TC2: Quadratic Temp coefficient) to temperature and proportional coefficients (VC1 linear $V_{gs}$ coefficient, VC2 Quadratic $V_{gs}$) to VGS. The temperature coefficients TC1 and TC2 are usually both positive, but not always. The $V_{gs}$ coefficient VC1 is usually positive and VC2 is negative, but not always. The input current ($I_{in}$) is converted to sensed current (Isen(T, $V_{gs}$) by the transconductance of an amplifier with a gain of $1/R_{sen}$, where $R_{sen}$ is the resistance of a sense resistor. The current sensed ($I_{sen}$(T, $V_{gs}$)) across the sense resistor is converted into the sensed voltage by multiplying $R_{gain}$ before compensating for temperature and $V_{gs}$ dependency.

The insight of this disclosure is that the sensed current at arbitrary values of T and $V_{gs}$, ($I_{sen}$ (T, $V_{gs}$)) can be converted to a stable compensated current ($I_{sen0}$) by dividing $I_{sen}$(T, Vgs) by $(1+TC1 \cdot \Delta T+TC2 \cdot \Delta T^2) \cdot (1+VC1 \cdot \Delta Vgs+ VC2 \cdot \Delta Vgs^2)$. The relationship between a sensed voltage at arbitrary temperature and $V_{gs}$ and the stable compensated voltage free from temperature and $V_{gs}$ variation from reference can then be expressed by the modification of Eq. 3 to:

$$\frac{V_{Sen}(T, V_{gs})}{(1 + TC1 \cdot \Delta T + TC2 \cdot \Delta T^2) \cdot (1 + VC1 \cdot \Delta Vgs + VC2 \cdot \Delta Vgs^2)} = \qquad \text{EQ. 4}$$
$$\frac{R_{gain} \cdot Iin \cdot R_{dson_0}}{R_{sen}} = V_{sen0}$$

According to aspects of the present disclosure, a first linear discrete voltage divider and multiple cascaded stages of switches may be generated with current paths having resistances corresponding to first order temperature coefficients, or first and second order temperature coefficients, or first, and second and higher order temperature coefficients at discrete temperatures and a second linear discrete voltage divider and multiple cascaded stages of switches may be generated with current paths having resistances corresponding to first order $V_{gs}$ coefficients, or first and second order $V_{gs}$ coefficients, or first, and second and higher order $V_{gs}$ coefficients at discrete $V_{gs}$, in series with the first linear discrete voltage divider to produce a stable compensated voltage related to the stable compensated current, $I_{sen0}$. The linear discrete voltage divider is a voltage divider circuit that uses an amplifier with series resistors where the inverting input of the amplifier is connected to feedback in the middle of the series resistors. The output of the voltage divider $V_{sen0}$ is calculated from the non-inverting input $V_{sen}$(T, $V_{gs}$), feedback node resistance $R_{T0}$, and output resistance $R_T$(T, $V_{gs}$) as:

$$V_{sen\_out} = V_{sen}(T, V_{gs}) \cdot \frac{R_{T0}^2}{R_T(T, V_{gs})} = V_{sen}(T, V_{gs}) \cdot \frac{R_{T0}}{R_T(T)} \cdot \frac{R_{T0}}{R_T(T)} \quad \text{EQ. 5}$$

$$R_T(T) = R_{T0} \cdot (1 + TC1 \cdot \Delta T + TC2 \cdot \Delta T^2) \quad \text{EQ. 5(a)}$$

$$R_T(V_{gs}) = R_{T0} \cdot (1 + VC1 \cdot \Delta V_{gs} + VC2 \cdot \Delta V_{gs}^2) \quad \text{EQ. 5(b)}$$

$$R_T(T, V_{gs}) = \quad \text{EQ. 5(c)}$$

$$R_{T0}^2 \cdot (1 + VC1 \cdot \Delta V_{gs} + VC2 \cdot \Delta V_{gs}^2) \cdot (1 + VC1 \cdot \Delta V_{gs} + VC2 \cdot \Delta V_{gs}^2)$$

The linear discrete voltage divider determines its output $V_{sen\_out}$ by controlling the value of $R_T(T, V_{gs})$, which is composed of unit resistors in series, each having a common resistance $R_{unit}$, and varies according to temperature and $V_{gs}$ information. The series connection of one unit resistor is tapped through multiple stages of cascaded switches to being $R_T(T, V_{gs})$ through the multiple stages of switches and the tapped node becomes the output of the linear discrete voltage divider. The voltage by series of $R_{unit}$ shows linear discrete step according to the number counting. In case of 1st order, $R_T$ increases linearly in increments of $R_{unit}$ and in the case of $2^{nd}$ order, $R_T$ increases by increments of $R_{unit}^2$. See FIG. 2 and its corresponding discussion for further information on the linear discrete voltage divider. This implementation of the linear discrete voltage divider creates $V_{sen\_out}$ using resistance paths having resistance RT(T) and $RT(V_{gs})$ to compensate for temperature and $V_{gs}$ Variation, respectively, as derived by EQ. 4 and EQ. S and then Vsen_out shows the same value as fully compensated sensed voltage, $V_{sen0}$ $$V_{sen\_out} = V_{sen}(T, V_{gs}) \cdot \frac{R_{T0}^2}{R_T(T) \cdot R_T(V_{gs})} = \quad \text{EQ. 6}$$

$$\frac{V_{sen0} \cdot (1 + TC1 \cdot \Delta T + TC2 \cdot \Delta T^2) \cdot (1 + VC1 \cdot \Delta V_{gs} + VC2 \cdot \Delta V_{gs}^2)}{(1 + TC1 \cdot \Delta T + TC2 \cdot \Delta T^2) \cdot (1 + VC1 \cdot \Delta V_{gs} + VC2 \cdot \Delta V_{gs}^2)} = V_{sen0}$$

The resistances $R_T(T)$ for temperature compensation, are generated by calculating discrete numbers $M_i$ and $N_i$ which correspond to the first and second temperature (TC1 and TC2) coefficients, respectively. Additionally higher order temperature coefficients ($TC_n$) may also be calculated in a similar way. The resistances $R_T(V_{gs})$ for $V_{gs}$, compensation are generated by calculating discrete numbers $P_j$ and $Q_j$ which correspond to the first and second Vgs (VC1 and VC2) coefficients, respectively. Additionally higher order Vgs coefficients ($VC_n$) may be calculated in a similar way. The i and j subscripts here indicate that the terms correspond to a particular temperature and particular $V_{gs}$, respectively. The relationship between $R_T(T)$ and $R_T(VGS)$ is provided by equations 7 and 8 respectively:

$$R_T(T) = R_{T0} \cdot \left(1 - M_i \cdot \left(\frac{R_{unit}}{R_{T0}}\right) - N_i \cdot \left(\frac{R_{unit}}{R_{T0}}\right)\right) \quad \text{EQ. 7}$$

$$R_T(Vgs) = R_{T0} \cdot \left(1 - P_j \cdot \left(\frac{R_{unit}}{R_{T0}}\right) - Q_j \cdot \left(\frac{R_{unit}}{R_{T0}}\right)\right) \quad \text{EQ. 8}$$

Where $M_i$, $N_i$, $P_j$ and $Q_j$ are calculated as shown in EQ.9~EQ.12, where $R_{unit}$ is a resistance with discrete unit chosen based on the operating conditions (Temperature range and Vgs range) for the device:

$$M_i = -\frac{TC1 \cdot \Delta T}{R_{unit}} \quad \text{EQ. 9}$$

$$N_i = -\frac{TC2 \cdot \Delta T^2}{R_{unit}} \quad \text{EQ. 10}$$

$$P_j = -\frac{VC1 \cdot \Delta Vgs}{R_{unit}} \quad \text{EQ. 11}$$

$$Q_j = -\frac{VC2 \cdot \Delta Vgs^2}{R_{unit}} \quad \text{EQ. 12}$$

This concept can be extended to higher order terms. For example, for $O_i$ an n order discrete number relating to an n order temperature TCn, coefficient the relationship is provided by:

$$O_i = -\frac{TCn \cdot \Delta T^n}{R_{unit}} \quad \text{EQ. 13}$$

Similarly, for $U_j$ an n order discrete number relating to an n order $V_{gs}$, coefficient VCn the relationship is provided by:

$$U_j = -\frac{VCn \cdot \Delta Vgs^n}{R_{unit}} \quad \text{EQ. 14}$$

In EQ. 14, $\Delta T$ is the current temperature ($T_i$) subtracted from the reference temperature ($T_0$) for the power MOSFET ($\Delta T = T_i - T_0$). Similarly, $\Delta V_{gs}$ is the difference between the current $V_{gs}(V_{gsj})$ and the reference $V_{gs}(V_{gs0})$ for the power MOSFET ($\Delta V_{gs} = V_{gsj} - V_{gs0}$).

Utilizing EQ. 13 and EQ. 14 one can generate expressions for $R_T(T)$ and $R_T(Vgs)$ for corresponding arbitrary numbers N T and of stages of cascaded switches as follows:

$$R_T(T) = R_{T0}\left(1 - \sum_{n=1}^{N_T} O_i \cdot \left(\frac{R_{unit}}{R_{T0}}\right)\right) \quad \text{EQ. 15}$$

$$R_T(Vgs) = R_{T0}\left(1 - \sum_{n=1}^{N_V} U_j \cdot \left(\frac{R_{unit}}{R_{T0}}\right)\right) \quad \text{EQ. 16}$$

While the discussion herein describes use of numbers corresponding to the first and second temperature coefficients at a discrete temperature and first and second Vgs coefficient at a discrete $V_{gs}$, the concept may be applied to just the first order coefficients like the first temperature coefficient at a discrete temperature and first $V_{gs}$ coefficient at a discrete $V_{gs}$. Such first order compensation reduces the output accuracy compared to implementations that include second order or higher temperature and $V_{gs}$ coefficient representations.

Figure 2:
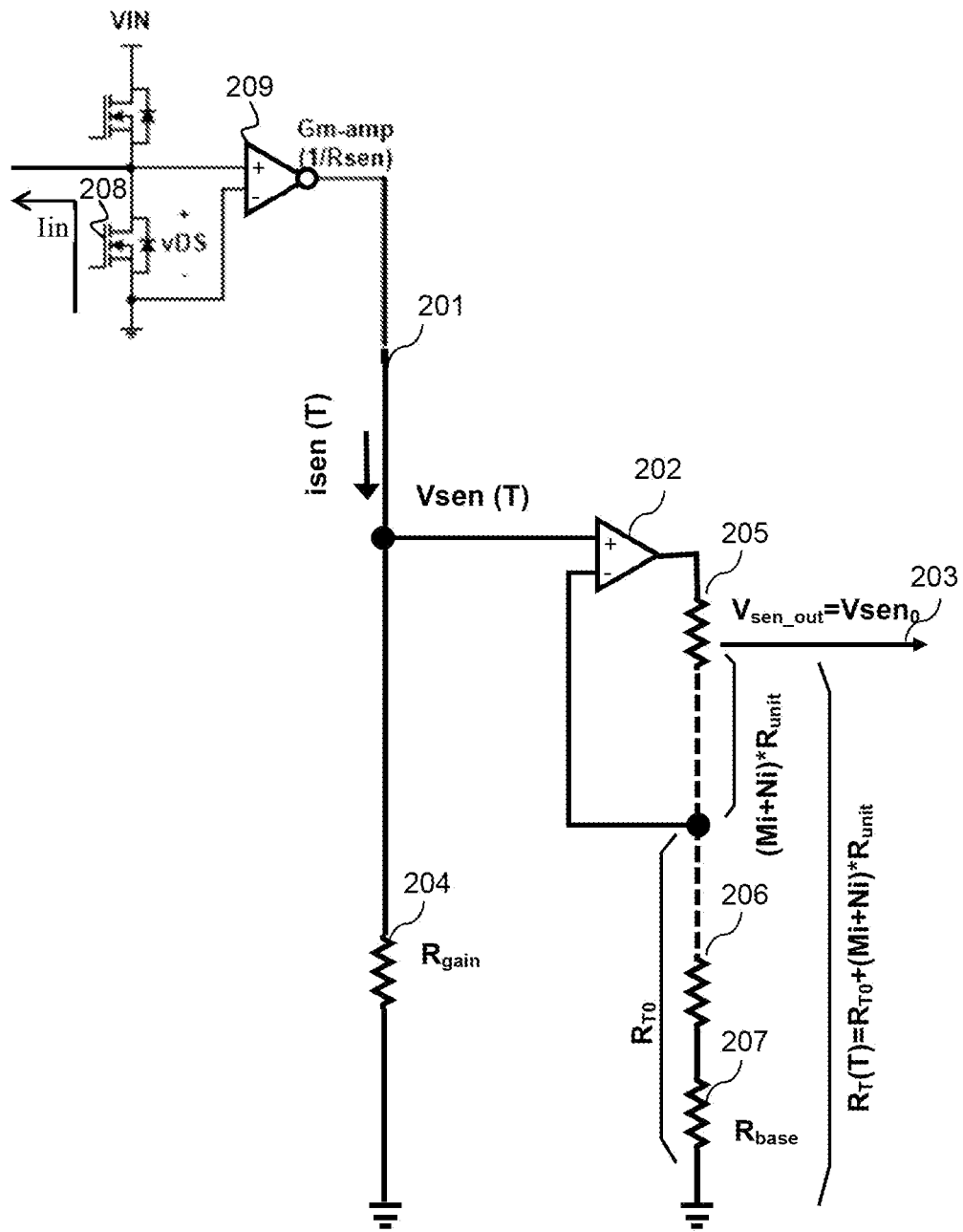
FIG. 2 is a simplified circuit diagram of a compensation device utilizing a linear discrete voltage divider to output a compensated voltage according to aspects of the present disclosure.

FIG. 2 is a simplified circuit diagram of a temperature compensation portion of the compensation device utilizing a linear discrete voltage divider to output a compensated voltage according to aspects of the present disclosure. The voltage divider receives sense current signal 201 $I_{sen}(T)$ from a conductive coupling with the drain of a low-side power MOSFET 208. Iii this example the sense current signal $I_{sen}(T)$ is the output of a transconductance amplifier, Gm-amp, 209 having its non-inverting input coupled to the source of the LS MOSFET 208 and its inverting output coupled to the drain of the LS MOSFET 208. Input current is converted to a sensed voltage $V_{sen}(T)$ by a gain resistor 204 having a resistance $R_{gain}$. The transconductance of the amplifier 209 converts the dropout voltage, vDS(T), which is generated by the input current, Iin, and LS MOSFET's on-resistance, Rdson(T), to the sensed current signal $I_{sen}(T)$. The amplifier 209 is has a gain of $1/R_{sen}$, where $R_{sen}$ is the resistance of a sense resistor (not shown). The current sensed $I_{sen}(T)$ by the sense resistor is converted into the sensed voltage $V_{sen}(T)$ by multiplying $R_{gain}$ before compensating for temperature with a linear discrete voltage amplifier 202 and a network of discrete unit resistors 205 in series.

The linear discrete voltage divider amplifier 202 in this example is an operational amplifier arranged in a non-inverting configuration with the non-inverting input receiving $V_{sen}(T)$ and the inverting input coupled to the output through the discrete unit resistors 205. The temperature compensated output voltage $V_{sen\_out}$ changes based on the resistance of the pathway 203 through some portion of the discrete unit resistors 205. According to aspects of the present disclosure multiple switched pathways 203 for $V_{sen\_out}$ may be provided, each pathway having a different resistance value dependent upon one or more associated temperature coefficients. Each pathway passes through a different number of unit resistors 205 in series. The series discrete unit resistor path resistance is $(M_i+N_i)*R_{unit}$ where $M_i$ is related to first order temperature coefficient and $N_i$ is related to a second order temperature coefficient as discussed above. $R_{unit}$ is a chosen incremental unit step resistor based on the operational temperature range or operational $V_{gs}$ range. A smaller $R_{unit}$ provides better resolution at the price of device complexity. The unit resistors 205 are in series with a base resistor 207 in order to make up for the resistance in proportion to the temperature coefficients, TC1 and TC2, of the MOSFET to the reference Temperature $R_{T0}$.

Figure 3:
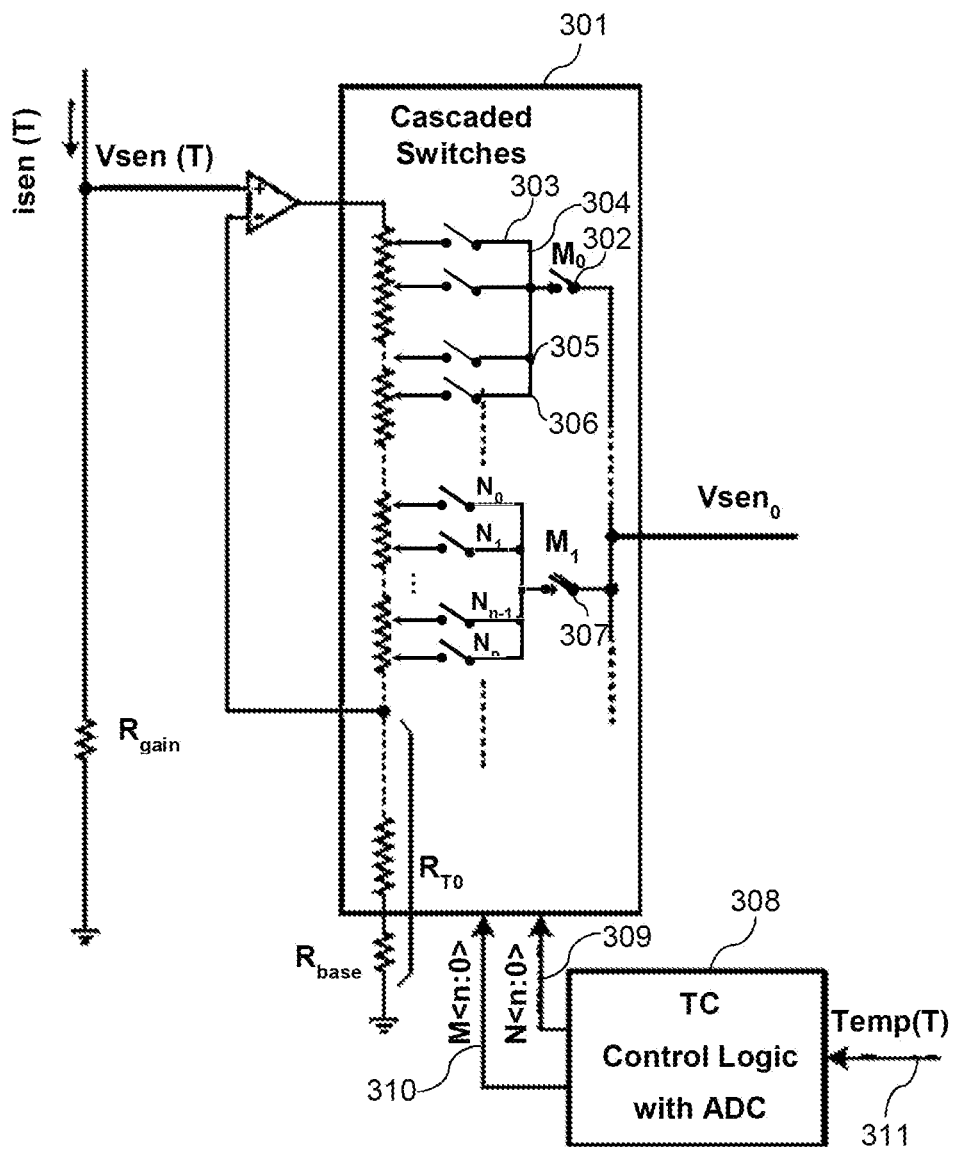
FIG. 3 is a circuit diagram of a compensation device utilizing a linear discrete voltage divider with cascading switches configured to output a temperature compensated voltage according to aspects of the present disclosure.

FIG. 3 is a circuit diagram of a compensation device utilizing a linear discrete voltage divider with two cascaded stages of switches configured to output a temperature compensated voltage according to aspects of the present disclosure. Here, the Cascading levels of switches 301 for temperature coefficient compensation are shown. The two cascaded stages of switches 301 as shown, may be implemented as Mask ROM switches and arranged in parallel with each path having an incremental unit resistor $R_{unit}$. According to alternative aspects of the present disclosure, the cascading levels of switches may include any suitable type of switching unit for example and without limitation, relays, transistors, vacuum tubes, and the like. The first temperature coefficient TC1 corresponds to the first stage of switches $M_i$ and second temperature coefficient TC2 corresponds to the second stage switches $N_i$ where the subscript i is a discrete temperature. By way of example and not by way of limitation, as shown, the first temperature coefficient switch 302 in the first stage of cascading switches corresponds to $M_0$, a plurality of switches 303, 304, 305, and 306 in the second level of cascading switches are connected in parallel with each other and in series with switch $M_0$. In the implementation shown, each switch in the level of cascading switches corresponding to first order temperature coefficients has multiple switches in a second level of cascading corresponding to second order temperature coefficients. According to alternative aspects of the present disclosure the number of switches corresponding to second order temperature coefficients, or second and higher order temperature coefficients may vary depending upon the shape or nonlinearity of the $R_{dson}$ versus temperature curve. For example, and without limitation, a linear Rdson versus temperature curve needs just the first stage for first order temperature compensation without any other cascaded stage of switches for second or higher order temperature coefficients.

Temperature coefficient control logic 308 may output first order compensating control signals 310 configured to control the switches corresponding to first order temperature coefficients like 302, 307 . . . . Additionally, the temperature coefficient control logic 308 may output second order compensating control signals 309 configured to control a group of second order switches 303, 304, 305 . . . 306, which are connected to a first order ($M_0$) switch 302. The temperature coefficient control logic 308 may receive a temperature dependent signal 311 and send a control signal to switches corresponding to the first order temperature coefficient and second order temperature coefficient for the temperature represented by the temperature dependent signal 311. The temperature coefficient control logic 308 may include an analog to digital converter to convert a continuous signal dependent upon temperature to a discrete signal usable with the multiple cascaded levels of switches 301. In general, for a given temperature value $T_i$ only the control logic 308 turns on only one first order switch corresponding to the value of M and only one cascaded second order switch corresponding to the value of $N_i$ to provide a unique number of series unit resistors corresponding to that temperature. In implementations involving third or higher order cascaded switches, only one switch of each such higher order level in the cascade corresponding to temperature value $T_i$ would be turned on.

While FIG. 3 is described with regards to temperature variation compensation aspects of the present disclosure are not so limited. Cascaded multiple stages of switches coupled with a linear discrete resistor controlled may be implemented to compensate for $V_{gs}$ variation in a similar manner as compensation of temperature changes. Each stage of the multiple cascaded stages of switches for $V_{gs}$ compensation may correspond to a different order (first, second, third, etc.) $V_{gs}$, coefficient. The resistance for each switch in the cascading levels of $V_{gs}$, compensation switches may be chosen based on a Voltage coefficient at a discrete temperature wherein each level of switch in the cascade represents a different $V_{gs}$ coefficient. V g, coefficient control logic may output signals to control the multiple cascaded stages of compensation switches to apply the correct $V_{gs}$ coefficient at any given measured $V_{gs}$, of the power MOSFET. An implementation of the linear discrete voltage divider, multiple cascaded stages of $V_{gs}$ compensation switches and $V_{gs}$, coefficient control logic can be seen in FIG. 5. In general, for a given $V_{gs}$ value $V_{gsj}$ only one first order switch corresponding to the value of $P_j$ and one cascaded second order switch corresponding to the value of $Q_j$ is turned on to provide a unique path resistance corresponding to that $V_{gs}$ value. In implementations involving third or higher order cascaded switches, only one switch of each such higher order level in the cascade corresponding to $V_{gs}$ value $V_{gsj}$ would, be turned on.

Function

Figure 4A:
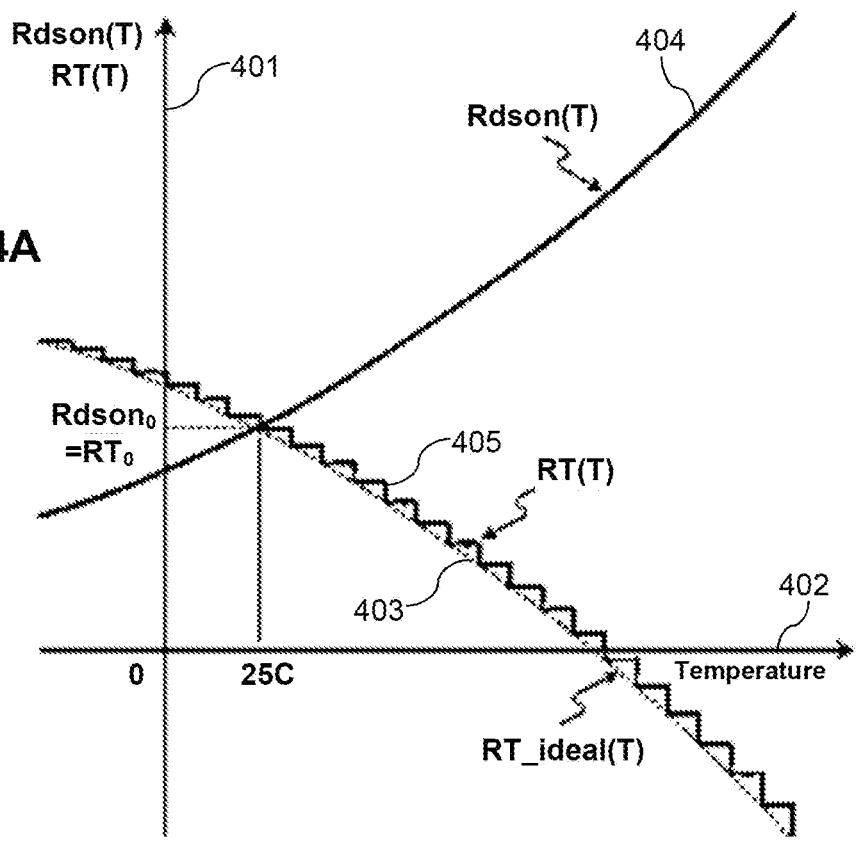
FIG. 4A is a line graph showing the resistance of the output of the compensation device in response to temperature changes compared to variations in $R_{dson}$ and the ideal compensation resistance according to aspects of the present disclosure.

FIG. 4A is a line graph showing the resistance of the output of the compensation device in response to temperature changes compared to variations in $R_{dson}$ and the ideal compensation resistance according to aspects of the present disclosure. The operation of the compensation device is shown with respect to resistance 401 versus temperature 402. The Unit resistances RT(T) 405 operate as a discrete step function. According to aspects of the present disclosure the discrete steps of RT(T) 405 are the output of the linear voltage divider and cascading switches. The cascading levels of switches are controlled by the TC control logic to make RT(T) follow the ideal Rdson compensation response curve RT_ideal(T) 403 to compensate for Rdson changes 404 due to temperature. It can be seen that RT_ideal(T) 403 is inversely related to Rdson(T) 404 with top and bottom symmetrical to the Rdson(T)=Rdson0=RT0 and RT_ideal(T) 403 intersects with Rdson(T) 404 at the reference temperature, Rdson0 or RT0 at T=25° C. Similarly, the curve of the discrete steps of the unit resistances RT(T) 405 also intersects the Rdson at the reference temperature. Thus, RT(T) 405 can provide enough compensation of the Ideal Rdson temperature response curve that is sufficiently accurate for most applications. As discussed above, additional accuracy may be gained through the addition of higher order coefficients allowing an even greater fidelity in the reproduction of RT_ideal(T).

Figure 4B:
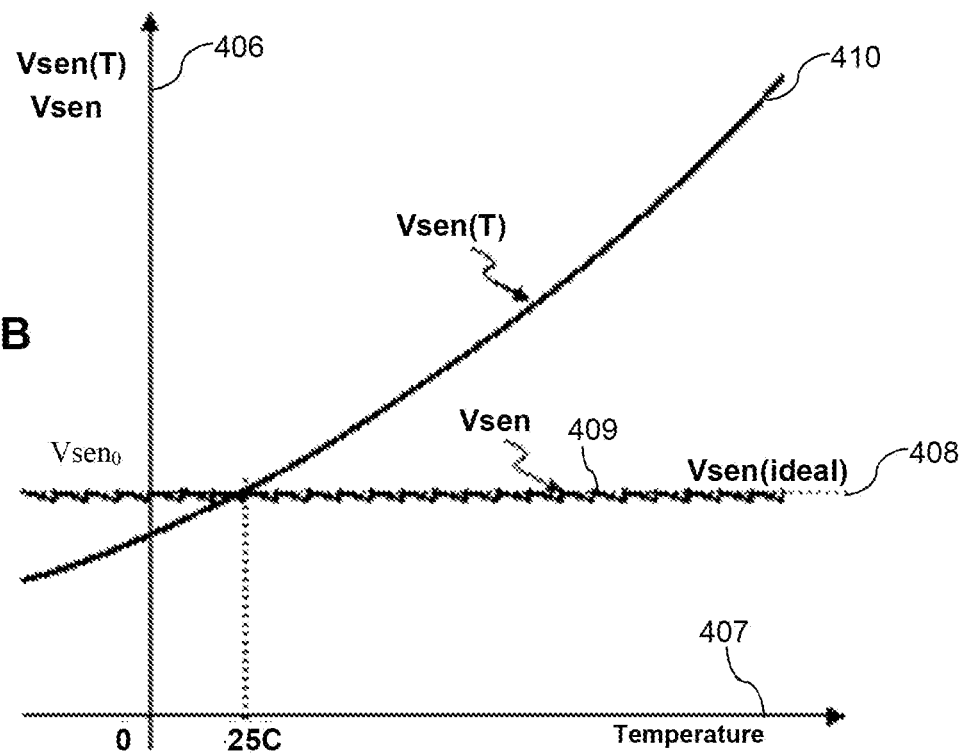
FIG. 4B is a line graph showing the output voltage of the compensation de-vice in response to changes in temperature compared to uncompensated voltage variation due to temperature and an ideal voltage output according to aspects of the present disclosure.

FIG. 4B is a line graph showing the output voltage of the compensation device in response to changes in temperature compared to uncompensated voltage variation due to temperature and an ideal voltage output according to aspects of the present disclosure. As shown the voltage 406 of the sensed voltage curve $V_{sen}(T)$ 410 varies with temperature 407 nonlinearly. The ideal voltage curve $V_{sen}$(Ideal) 408 is fixed at the operational voltage at reference temperature (T=25° C.). According to aspects of the present disclosure the compensated voltage output of the compensation device $V_{sen}$ 409 follows $V_{sen}$(ideal)=$V_{sen0}$ 408 in a discrete stepped pattern. During operation, the TC control logic activates the appropriate switches in the cascading switches for the resistance corresponding to the temperature coefficient at the current MOSFET temperature. The TC control logic ensures that the $V_{sen}$ curve follows the $V_{sen}$(Ideal). Thus, the compensation device operates to maintain a stable voltage despite changes in temperature. Here the reference temperature used in FIGS. 4A and 4B is 25° C. but aspects of the present disclosure are not so limited, the reference temperature may be any reference temperature, e.g., any temperature at which the monitored power MOSFET is rated to operate normally without variations in output due to temperature.

Figure 4C:
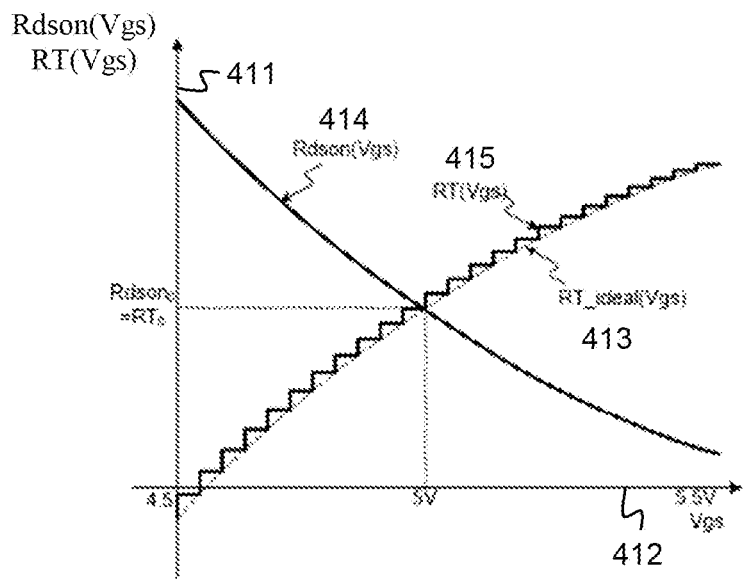
FIG. 4C is a line graph showing the resistance of the output of the compensation device in response to changes in gate-source voltage $V_{gs}$, compared to variations in $R_{dson}$ and the ideal compensation resistance according to aspects of the present disclosure.

As noted above, a voltage divider network similar to the one depicted in FIG. 3 may implement compensation of variation in Rdson with gate-source voltage Vgs. FIG. 4C is a line graph showing the resistance of the output of the compensation device in response to changes in gate-source voltage Vgs compared to variations in $R_{dson}$ and the ideal compensation resistance according to aspects of the present disclosure. The operation of the compensation device is shown with respect to resistance 411 versus Vgs 412. The unit resistances RT(Vgs) 415 operate as a discrete step function. According to aspects of the present disclosure the discrete steps of RT(Vgs) 415 are the output of the linear voltage divider and cascaded switches. The cascading levels of switches are controlled by a Vgs coefficient (VC) control to make RT(Vgs) follow the ideal Rdson compensation response curve RT_ideal(Vgs) 413 to compensate for changes in Rdson with Vgs. It can be seen that RT_ideal(Vgs) 413 is inversely related to Rdson(Vgs) 414 with top and bottom symmetrical to the Rdson(Vgs)=Rdson0=RT0 and RT_ideal(Vgs) 413 intersects with Rdson(Vgs) 414 at the reference voltage, which is 5 volts in the illustrated example. Similarly, the curve of the discrete steps of the unit resistances RT(Vgs) 415 also intersects the Rdson at the reference voltage. Thus, RT(Vgs) 415 can provide enough compensation of the Ideal Rdson versus Vgs response curve that is sufficiently accurate for most applications. As discussed above, additional accuracy may be gained through the addition of higher order coefficients allowing an even greater fidelity in the reproduction of RT_ideal(Vgs).

Figure 4D:
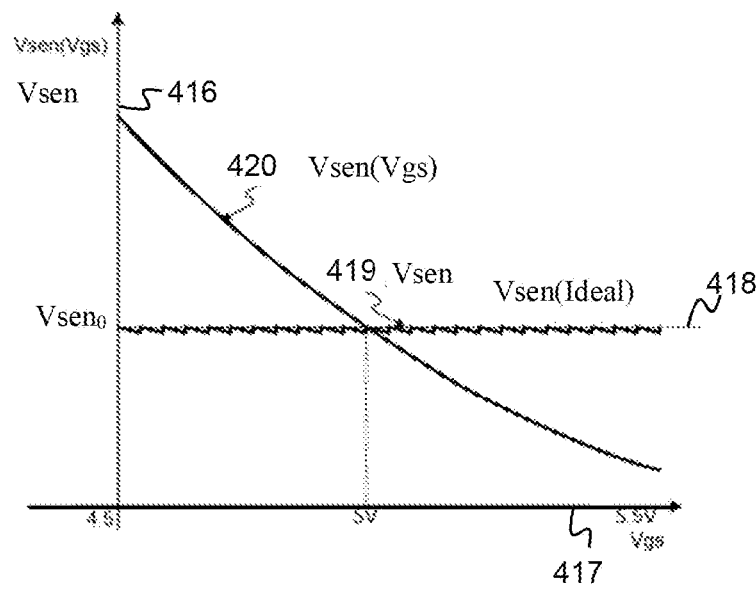
FIG. 4D is a line graph showing the output voltage of the compensation device in response to changes in gate-source voltage $V_{gs}$ compared to uncompensated voltage variation due to temperature and an ideal voltage output according to aspects of the present disclosure.

FIG. 4D is a line graph showing the output voltage of the compensation device in response to changes in gate source voltage Vgs compared to uncompensated voltage variation due to Vgs and an ideal voltage output according to aspects of the present disclosure. As shown the voltage 416 of the sensed voltage curve $V_{sen}(Vgs)$ 420 varies with $V_{gs}$ 417 nonlinearly. The ideal voltage curve $V_{sen}$(Ideal) 408 is fixed at the operational voltage at reference value of Vgs, which is 5 volts in this example. According to aspects of the present disclosure the compensated voltage output of the compensation device $V_{sen0}$ 419 follows $V_{sen0}$ (ideal) 418 in a discrete stepped pattern. During operation, the aforementioned VC control logic activates the appropriate switches in the cascaded switches for the resistance corresponding to the Vgs coefficient at the current MOSFET Vgs value. The VC control logic ensures that the $V_{sen0}$ curve follows $V_{sen0}$ (Ideal). Thus, the compensation device operates to maintain a stable voltage despite changes in Vgs. Here the reference voltage used in FIGS. 4C and 4D is 5 volts but aspects of the present disclosure are not so limited, the reference temperature may be any reference voltage, e.g., any Vgs value at which the monitored power MOSFET is rated to operate normally.

Device with Temperature and $V_{gs}$ Compensation

Figure 5:
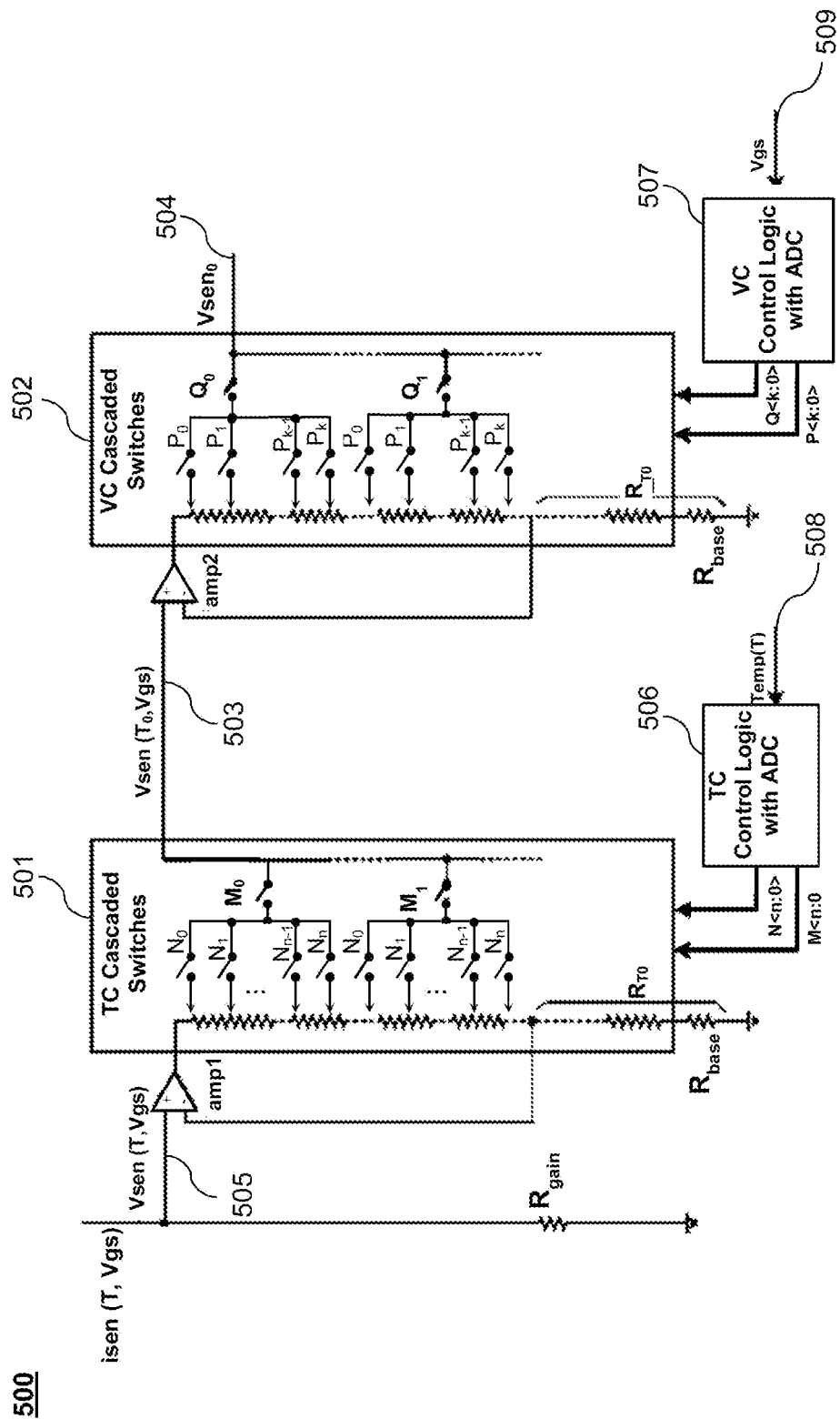
FIG. 5 is a circuit diagram of a compensation device using linear discrete voltage dividers to compensate for both temperature and $V_{gs}$ variation according to aspects of the present disclosure.

FIG. 5 is a circuit diagram of a compensation device 500 using linear discrete voltage dividers to compensate for both temperature and $V_{gs}$ variation according to aspects of the present disclosure. In general terms, the device 500 uses a first voltage divider and cascaded stages of switches to generate a first output that compensates an input signal for the effect of a first variable and then generates from the first output an input to a second voltage divider and cascaded switches to generate a second output that compensates the first output for the effect of a second variable. In the implementation shown, the input sense voltage Vsen(T,Vgs) 505 is first compensated for temperature with a first linear discrete voltage divider and multiple cascaded stages of switches 501, which may be configured as discussed above with respect to FIG. 3. The temperature coefficient cascading switches 501 receive signals from temperature coefficient (TC) control logic 506. The temperature coefficient control logic 506 receives a voltage, Temp(T), which is dependent on a measured temperature 508 of the power MOSFET. The TC control logic 506 may include an analog to digital converter (ADC) that converts an input analog temperature-dependent voltage to a digital output having some predetermined number of bits. The TC logic 506 produces outputs corresponding to the first order temperature coefficient for the Rdson at the measured temperature and corresponding to the second order temperature coefficient for the Rdson at the measured temperature. Alternatively, the temperature coefficient control logic 506 may be configured to generate outputs corresponding to a first order temperature coefficient, second order temperature coefficient and higher temperature order coefficient. The outputs of the temperature coefficient control logic 506 may be configured to activate switches in the Temperature coefficient cascaded switches 501. As discussed above, for a given temperature value $T_i$ the temperature coefficient control logic 506 would turn on only one first order switch corresponding to the value of $M_i$ and one cascaded second order switch corresponding to the value of $N_i$ to provide a unique path resistance corresponding to that temperature. In implementations involving third or higher order cascaded switches, only one cascaded switch of each such higher order level in the cascade corresponding to temperature value $T_i$ would be turned on.

In the implementation shown, the temperature compensated voltage $V_{sen}(T_0, Vgs)$ 503 is output to a second linear discrete voltage divider and set of $V_{gs}$ coefficient switches 502 in multiple cascaded stages. The $V_{gs}$ coefficient cascaded switches 502 may be controlled by Vgs coefficient control logic 507. The Vgs coefficient control logic 507 receives a $V_{gs}$ dependent voltage 509 measured from the Power MOSFET. The Vgs coefficient control logic 507 converts the $V_{gs}$ dependent voltage input to outputs corresponding to the first order $V_{gs}$ coefficient for the $R_{dson}$ at the measured $V_{gs}$ and the second order $V_{gs}$ coefficient for the $R_{dson}$ at the measured $V_{gs}$. Alternatively, the temperature coefficient control logic 506 may be configured to generate outputs corresponding to a first order $V_{gs}$ coefficient, second order $V_{gs}$ coefficient and higher $V_{gs}$ order coefficient. The outputs of the $V_{gs}$ coefficient control logic 507 may be configured to activate switches in the temperature coefficient cascading switches 501. According to aspects of this implementation the output of the linear discrete voltage divider and VC Cascaded switches 502 controlled by the $V_{gs}$ Coefficient control logic 507 is a Temperature and $V_{gs}$ compensated voltage $Vsen(T_0, V_{gs0}) = V_{sen0}$ 504.

While in the implementation shown in FIG. 5 the voltage $V_{sen}(T_0, V_{gs0})$ is first compensated for temperature and then for $V_{gs}$, aspects of the present disclosure are not so limited, the $V_{gs}$ coefficient linear discrete voltage divider, and voltage coefficient cascading switches may be arranged before the temperature coefficient voltage divider and temperature coefficient cascading switches in the path of the current. This may be done so long as the effect of temperature and gate-source voltage on $V_{sen}$ is commutative. Thus, the $V_{gs}$ may be compensated before temperature with no change in the $V_{sen0}$ output compared to an implementation that compensates for temperature before $V_{gs}$ according to this alternative implementation.

As discussed above, for a given $V_{gs}$ value $V_{gsj}$ the $V_{gs}$ control logic 507 turns on only one first order switch corresponding to the value of $P_j$ and one cascaded second order switch corresponding to the value of $Q_j$ to provide a unique path resistance corresponding to that $V_{gs}$ value. In implementations involving third or higher order cascaded switches, only one switch of each such higher order level in the cascade corresponding to $V_{gs}$ value $V_{gsj}$ would be turned on.

The temperature coefficient control logic 506 and the $V_{gs}$ coefficient control logic 507 may control their corresponding set of cascading switches with output signals in any suitable manner. By way of example and not by way of limitation each switch in both the coefficient cascading switches may be individually addressed and the coefficient control logic 506 may output a signal corresponding to the address of the switch and a command to turn the switch "on," alternatively the temperature coefficient control logic 506 may have an output for each switch at each level of the cascading switches and an output to one switch at each level may be pulled to a high voltage (relative to the low "off state" voltage) to turn on switch and pulled low to turn off the switch. The control logic 506 turns on only one switch for each stage. For example, if there are two cascaded stages, one switch is turned on for each stage. Aspects of the present disclosure are not limited to implementations involving compensation for temperature $T_i$ or gate-source voltage $Vgs_j$. Various other variables may be similarly compensated by using multiple cascaded linear discrete stages of the type described herein. Examples of other variables that affect Rdson that may be similarly compensated include, without limitation, the current flowing through the MOSFET in the ON state, fab process, package characteristics, and the like. It is desirable for such variables to be validated to be commutative in their effect. The device 500 may be modified to compensate for three or more variables by adding additional voltage dividers and cascaded stages of switches. Again, it is desirable that the effect of the variables being compensated be commutative, i.e., that the compensation can be formed in any order.

While the above is a complete description of the preferred embodiment of the present invention, it is possible to use various alternatives, modifications, and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A," or "An" refers to a quantity of one or more of the item following the article, except where expressly stated otherwise. The appended claims are not to be interpreted as including means-plus-function limitations, unless such a limitation is explicitly recited in a given claim using the phrase "means for." Additionally, in the appended claims the term "or" is to be construed with its ordinary meaning as "inclusive or."

What is claimed is:

1. A power MOSFET drain-source on resistance (Rdson) compensation device comprising:
   circuitry configured to receive an input signal proportional to a voltage drop across a power MOSFET, a temperature dependent information corresponding to a temperature $T_i$ of the MOSFET and a gate-source voltage dependent information corresponding to a current gate-source voltage $Vgs_j$ of the MOSFET, wherein the circuitry includes control logic and a first linear discrete voltage divider, wherein the first linear discrete voltage divider is configured to output a compensated voltage based on at least one compensating control signal from the control logic that is based on at least one of the temperature dependent signal or gate-source voltage dependent signal.

2. The device of claim 1 where in the control logic is temperature coefficient control logic wherein the compensated voltage is temperature compensated voltage.

3. The device of claim 2 wherein the at least one temperature coefficient control logic output includes outputs corresponding to a first order temperature coefficient compensation term output and a second order temperature coefficient compensation term.

4. The device of claim 3 wherein the at least one temperature coefficient control logic output also includes one or more outputs corresponding to temperature coefficient terms that are a higher order than the second order temperature coefficient term.

5. The device of claim 2 wherein the circuitry further includes voltage coefficient control logic and a second linear discrete voltage divider, wherein the second linear discrete voltage divider is configured to output a gate-source voltage compensated voltage based on an at least one output from the voltage coefficient control logic that is based at least on the gate-source voltage dependent signal.

6. The device of claim 5 wherein the first linear discrete voltage divider receives the input signal proportional to the voltage drop across the power MOSFET and the second linear discrete voltage divider receives the temperature compensated voltage and wherein the output of the second linear discrete voltage divider is both temperature compensated and gate-source voltage compensated.

7. The device of claim 5 wherein the at least one gate-source voltage coefficient control logic output includes outputs corresponding to a first order gate-source coefficient compensation term output and a second order gate-source coefficient compensation term.

8. The device of claim 7 wherein the at least one gate-source voltage coefficient control logic output also includes one or more outputs corresponding to gate-source voltage coefficient terms that are a higher order than the second order gate-source voltage coefficient term.

9. The device of claim 1 wherein the first linear discrete voltage divider includes an arrangement of output switches along a series of unit resistors of resistance $R_{unit}$ wherein each output switch in the arrangement of output switches is configured to tap a different number of unit resistors.

10. The device of claim 9 wherein the arrangement of output switches includes two or more cascaded stages of output switches wherein each stage corresponds to a different order of temperature coefficient.

11. The device of claim 9 wherein the arrangement of output switches includes two or more cascaded stages of output switches wherein each stage corresponds to a different order of gate-source voltage coefficient.

12. The device of claim 9 wherein the arrangement of output switches includes two or more cascaded stages of output switches, wherein each stage of the two or more cascaded stages of output switches corresponds to a different order of temperature coefficient, wherein for a given value of the temperature dependent information the control logic is configured to turn on only one switch in each stage of the two or more cascaded stages of output switches to provide a unique path resistance $R_T(T)$ corresponding to the given value of the temperature dependent information.

13. The device of claim 12, wherein $$R_T(T) = R_{T0} \cdot \left(1 - M_i \cdot \left(\frac{R_{unit}}{R_{T0}}\right) - N_i \cdot \left(\frac{R_{unit}}{R_{T0}}\right)\right),$$

where $R_{T0}$ is a value of Rdson at a reference temperature $$T_0, M_i = -\frac{TC1 \cdot \Delta T}{R_{unit}}, N_i = -\frac{TC2 \cdot \Delta T^2}{R_{unit}},$$

TC1 is a first order temperature coefficient, TC2 is a second order temperature coefficient and $\Delta T = T_i - T_0$.

14. The device of claim 9 wherein the arrangement of output switches includes two or more cascaded stages of output switches, wherein each stage of the two or more cascaded stages of output switches corresponds to a different order of gate-source voltage coefficient, wherein for a given value of the gate-source voltage dependent information the control logic is configured to turn on only one switch in each stage of the two or more cascaded stages of output switches to provide a unique path resistance $R_T(Vgs)$ corresponding to the given value of the gate-source voltage dependent information corresponding to Vgsj.

15. The device of claim 14, wherein $$R_T(Vgs) = R_{T0} \cdot \left(1 - P_j \cdot \left(\frac{R_{unit}}{R_{T0}}\right) - Q_j \cdot \left(\frac{R_{unit}}{R_{T0}}\right)\right),$$

where $$P_j = -\frac{VC1 \cdot \Delta Vgs}{R_{unit}}, Q_j = -\frac{VC2 \cdot \Delta Vgs^2}{R_{unit}},$$

VC1 is a first order Vgs coefficient, VC2 is a second order Vgs coefficient, where $T_0$ is a reference temperature, $R_{T0}$ is a value of Rdson at the reference temperature $T_0$, $Vgs_0$ is a reference value, and $\Delta Vgs = Vgs_j - V_{gs0}$.

16. The device of claim 9 wherein the arrangement of output switches includes a first set of $N_T$ cascaded stages of output switches, and a second set of $N_V$ cascaded stages of output switches, wherein each stage of the $N_T$ cascaded stages of output switches in the first set corresponds to a different order of temperature coefficient, wherein for a given value of the temperature dependent information the control logic is configured to turn on only one switch in each stage of the $N_T$ cascaded stages of output switches in the first set to provide a unique path resistance $R_T(T)$ corresponding to the given value of the temperature dependent signal, and wherein for a given value of the gate-source voltage dependent information the control logic is configured to turn on only one switch in each stage of the $N_V$ cascaded stages of output switches in the second set to provide a unique path resistance $R_T(Vgs)$ corresponding to the given value of the gate-source voltage dependent information.

17. The device of claim 16, wherein $$R_T(T) = R_{T0}\left(1 - \sum_{n=1}^{N_T} O_i \cdot \left(\frac{R_{unit}}{R_{T0}}\right)\right) \text{ and } R_T(Vgs) = R_{T0}\left(1 - \sum_{n=1}^{N_V} U_j \cdot \left(\frac{R_{unit}}{R_{T0}}\right)\right)$$

where $$O_i = \frac{TCn \cdot \Delta T^n}{R_{unit}},$$

TCn is an $n^{th}$ order temperature coefficient, $\Delta T = T_i - T_0$, $$U_j = -\frac{VCn \cdot \Delta Vgs^n}{R_{unit}},$$

VCn is an $n^{th}$ order Vgs coefficient, $\Delta Vgs = Vgs_j - Vgs_0$, $R_{T0}$ is a value of Rdson at a reference temperature $T_0$, $Vgs_0$ is a reference gate-source voltage value and $N_T$ and $N_V$ are greater than or equal to 1.

18. The device of claim 1 wherein the control logic includes an analog to digital converter.

* * * * *